(12) United States Patent
Sakurai

(10) Patent No.: US 8,450,848 B2
(45) Date of Patent: May 28, 2013

(54) SEMICONDUCTOR DEVICE AND METHOD FOR FABRICATING THE SAME

(75) Inventor: Daisuke Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 12/711,691

(22) Filed: Feb. 24, 2010

(65) Prior Publication Data

US 2010/0148362 A1 Jun. 17, 2010

Related U.S. Application Data

(63) Continuation of application No. PCT/JP2009/002284, filed on May 25, 2009.

(30) Foreign Application Priority Data

Oct. 23, 2008 (JP) .................................. 2008-272969
Apr. 2, 2009 (JP) .................................. 2009-090206

(51) Int. Cl.
*H01L 23/48* (2006.01)

(52) U.S. Cl.
USPC .................... 257/738; 257/737; 257/E23.021

(58) Field of Classification Search
USPC .......... 257/737, 738, 778, 779, 780, E23.021, 257/E23.069, E23.116, E23.123, E23.194
See application file for complete search history.

(56) References Cited

U.S. PATENT DOCUMENTS

| | | | |
|---|---|---|---|
| 5,128,746 A | 7/1992 | Pennisi et al. | |
| 6,121,689 A | 9/2000 | Capote et al. | |
| 6,281,046 B1 * | 8/2001 | Lam | 438/113 |
| 6,297,560 B1 | 10/2001 | Capote et al. | |
| 6,333,206 B1 | 12/2001 | Ito et al. | |
| 6,335,571 B1 | 1/2002 | Capote et al. | |
| 6,518,677 B1 | 2/2003 | Capote et al. | |
| 6,566,234 B1 | 5/2003 | Capote et al. | |
| 6,617,046 B2 | 9/2003 | Noro et al. | |
| 6,796,025 B2 | 9/2004 | Imamura et al. | |
| 7,847,417 B2 * | 12/2010 | Araki et al. | 257/778 |
| 7,902,678 B2 * | 3/2011 | Ohuchi et al. | 257/778 |
| 2002/0014703 A1 | 2/2002 | Capote et al. | |
| 2002/0031868 A1 | 3/2002 | Capote et al. | |
| 2002/0151106 A1 | 10/2002 | Noro et al. | |
| 2003/0218261 A1 | 11/2003 | Capote et al. | |
| 2004/0046252 A1 * | 3/2004 | Fujimori et al. | 257/734 |
| 2005/0218517 A1 | 10/2005 | Capote et al. | |

(Continued)

FOREIGN PATENT DOCUMENTS

| | | |
|---|---|---|
| JP | 2000-228424 | 8/2000 |
| JP | 2000-228424 A | 8/2000 |

(Continued)

*Primary Examiner* — Eduardo A Rodela

(74) *Attorney, Agent, or Firm* — McDermott Will & Emery LLP

(57) ABSTRACT

A semiconductor device includes an electronic part including an electrode, a substrate including a substrate electrode electrically connected to the first electrode on an upper surface thereof, the first substrate electrode and the first electrode being arranged, facing each other, a connecting member configured to connect the electrode with the substrate electrode, and a sealing material including a first resin portion which contains flux and contacts at least a connection portion between the connecting member and the substrate electrode, and a second resin portion which contains a lower concentration of flux than that of the first resin portion. A gap between the electronic part and the substrate is filled with the sealing film.

7 Claims, 12 Drawing Sheets

U.S. PATENT DOCUMENTS

| | | |
|---|---|---|
| 2005/0233567 A1 | 10/2005 | Kim et al. |
| 2007/0134844 A1 | 6/2007 | Katoh et al. |
| 2008/0217770 A1 * | 9/2008 | Fukuda .................. 257/737 |

FOREIGN PATENT DOCUMENTS

| | | |
|---|---|---|
| JP | 2002-241617 A | 8/2002 |
| JP | 2004-291054 | 10/2004 |
| JP | 2005-223330 | 8/2005 |
| JP | 2006-19599 A | 1/2006 |
| JP | 4047754 | 11/2007 |
| WO | WO 2007/083351 A1 | 7/2007 |

* cited by examiner (a)

(b)

(c)

(a)

(b)

(c)

(a)

(b)

(a)

(b)

(c)

(a)

(b)

(c)

(a)

(b)

(c)

(a)

(b)

SEMICONDUCTOR DEVICE AND METHOD FOR FABRICATING THE SAME

CROSS-REFERENCE TO RELATED APPLICATIONS

This is a continuation of PCT International Application PCT/JP2009/002284 filed on May 25, 2009, which claims priority to Japanese Patent Applications No. 2008-272969 filed on Oct. 23, 2008 and No. 2009-090206 filed on Apr. 2, 2009. The disclosures of these applications including the specifications, the drawings, and the claims are hereby incorporated by reference in their entirety.

BACKGROUND

The technology disclosed herein relates to configurations of semiconductor devices including a semiconductor element and a mounting substrate, and more particularly, to configurations and methods for connecting a semiconductor element with a mounting substrate.

In recent years, in order to simultaneously increase the density of circuitry provided in a semiconductor element and the number of pins of electrode terminals, attempts have been made to reduce the pitch and area of the electrode terminals of the semiconductor element. To achieve this, when the semiconductor element is mounted onto a mounting substrate by a flip chip mounting technique, a strict requirement is placed on a sealing resin which is injected between the semiconductor element and the mounting substrate.

In typical flip chip mounting, protruding electrodes such as solder bumps or the like are formed on electrode terminals of a semiconductor element such as an LSI or the like, and the resultant semiconductor element is bump-connected and mounted to connection terminals of a mounting substrate by pressure bonding and heating.

However, the pitch has been significantly narrowed, and therefore, if electrode terminals are provided at a periphery of the semiconductor substrate as in the conventional art, a short circuit may occur between the electrode terminals, and a connection fault or the like may occur due to a distortion caused by a difference in thermal expansion coefficient between the semiconductor element and the mounting substrate. Therefore, the pitch of electrode terminals has been broadened by arranging the electrode terminals two-dimensionally. However, the pitch has recently been significantly narrowed even in two-dimensional arrangements.

Flip chip bonding using solder bumps may be carried out by the following known method: washing is performed using flux after solder bonding, and a sealing resin is injected before being thermally cured. In this method, after the flux is supplied onto electrodes of a mounting substrate, a semiconductor element on which solder bumps have been formed are positioned and mounted onto the mounting substrate. Thereafter, the solder is melted and bonded by heating means such as a reflow furnace or the like before the flux component is dissolved and washed out by immersing the mounting substrate in washing liquid. Thereafter, a sealing resin is injected, using a dispenser or the like, into a void between the semiconductor element and the mounting substrate so as to enhance the reliability of resistance to falling and bending of the solder bonding portions, and thereafter, the sealing resin is thermally cured. However, in recent years, the pitch of the solder bonding portions has been narrowed and the gap between the semiconductor element and the electrode of the mounting substrate has also been reduced, and therefore, it is difficult for washing liquid to circulate, so that flux residues remain on the mounting substrate. As a result, the following drawbacks may occur: an open circuit fault or peeling-off occurring in use environments; and the void is too narrow to exhibit the effect of capillarity, and therefore, it takes time to inject the sealing resin and the aforementioned bonding method is not applicable to manufacture.

In order to reduce or avoid such drawbacks, a sealing adhesive containing flux may be supplied onto a substrate, and thereafter, a semiconductor element on which solder bumps have been formed may be mounted onto the substrate, and the sealing adhesive may be thermally cured by heating and pressing means, simultaneously with solder bonding (see, for example, Japanese Patent No. 2589239). FIGS. 12A and 12B are cross-sectional views showing a conventional semiconductor element mounting method described in Japanese Patent No. 2589239. In this method, an adhesive material 120 containing flux is supplied onto a substrate 100, and thereafter, solder bumps 140 provided on an active surface (circuit-formed surface) of a semiconductor element 130 are connected with a metallized pattern 110 provided on the substrate 100.

However, when this method is applied to a thin semiconductor element, the pressure may cause the sealing adhesive to overflow and extend around to a back surface of the semiconductor element. In this case, the semiconductor element may be broken due to a difference in linear expansion coefficient between the semiconductor substrate and the sealing adhesive when heat is applied thereto during reflowing or the like after thermal curing.

Therefore, a sealing film containing flux may be provided on the substrate so that the amount of the sealing adhesive can be easily controlled, thereby reducing the sealing adhesive flowing around to the back surface of the semiconductor element (see, for example, Japanese Patent No. 4047754). Another technique has been described in Japanese Patent Laid-Open Publication No. 2005-223330.

SUMMARY

However, a considerably strict requirement is placed on a reduction in the pitch between electrodes, and therefore, if the sealing adhesive contains flux as in Japanese Patents No. 2589239 and No. 4047754, an active agent (e.g., fluorine, chlorine, sulfur, etc.) contained in the flux which is present in a solder bonding portion may cause corrosion of the solder bonding portion at high temperature and high humidity, or ion migration may occur in a high-temperature and high-humidity biasing environment, leading to an electrical short circuit fault.

Moreover, when a low-dielectric constant film (so-called low-k film or ULk (Ultra Low-k) film, etc.) is used as an interlayer insulating film of a semiconductor element for the purpose of achieving a reduction in wiring rule or high-speed signal processing, the low-dielectric constant film is caused to be porous, i.e., have a large number of holes of several nanometers, so as to reduce its own dielectric constant. Therefore, if the flux-containing material contacts the porous insulating film, the porous insulating film may be impregnated with the active agent which spreads into the holes in a high-temperature and high-humidity environment, and therefore, corrosion or ion migration may occur in minute wirings made of copper, aluminum or the like.

In view of the aforementioned drawbacks, the detailed description describes implementations of a semiconductor device having an improved reliability of connection between electronic parts, such as a semiconductor element and the like, and a substrate, and its fabrication method.

To achieve the aforementioned object, a semiconductor device according to an example of the present disclosure includes a first electronic part including a first electrode, a first substrate including a first substrate electrode electrically connected to the first electrode on an upper surface thereof, wherein the first substrate electrode and the first electrode are arranged, facing each other, a first connecting member configured to connect the first electrode with the first substrate electrode, and a sealing material including a first resin portion which contains flux and contacts at least a first connection portion between the first connecting member and the first substrate electrode, and a second resin portion which does not contain the flux or contains a lower concentration of the flux than that of the first resin portion.

With this configuration, the first resin portion containing flux contacts the connection portion between the first connecting member and the first substrate electrode. Therefore, when the first electrode is bonded with the first substrate electrode, an oxide film or the like on surfaces of the first substrate electrode and the first connecting member is removed, whereby the bonding reliability between the first connecting member and the first substrate electrode is improved. Moreover, the sealing material has the first resin portion containing flux and the second resin portion containing a lower concentration of flux. Therefore, the amount of flux in the sealing material is reduced as compared to that in the conventional art, and therefore, the occurrence of corrosion and ion migration in a connection portion between the electrode and the connecting member is reduced. Moreover, even when a porous material such as a low-dielectric constant material or the like is used for a multilayered wiring layer, the occurrence of corrosion of the wiring and ion migration in the wiring layer can be reduced.

The sealing material may be in various shapes, such as liquid and the like, in addition to a film shape. When the sealing material is in the shape of film, it is possible to particularly effectively reduce the resin flowing around to a back surface of the first electronic part in a sealing step.

Note that the first resin portion may be provided separately on each of the substrate electrode and the electrode if the first resin portion contacts a connection portion between the first connecting member and the first substrate electrode, or may be in the shape of a layer.

A method for fabricating a semiconductor device according to an example of the present disclosure, includes the steps of (a) joining a sealing material including a first resin portion which contains flux and a second resin portion which does not contain the flux or contains a lower concentration of the flux than that of the first resin portion, with an upper surface of a first substrate on which a first substrate electrode is provided, so that the first resin portion is provided on or over the first substrate electrode, covering the first substrate electrode, (b) after step (a), mounting a first electronic part including a first electrode onto the first substrate so that the first electrode is positioned to face the first substrate electrode, and (c) after step (b), connecting the first electrode with the first substrate electrode using a first connecting member, and sealing at least the upper surface of the first substrate using the sealing material.

With this method, when the first electrode is connected with the first substrate electrode in step (c), an oxide film formed on surfaces of the first substrate electrode and the first connecting member is removed by flux, and therefore, the first substrate electrode and the first connecting member can be more reliably bonded with each other. Moreover, the sealing material includes the first resin portion containing and the second resin portion a lower concentration of flux, and therefore, the amount of flux in the resin film can be reduced as compared to that in the conventional art, whereby the occurrence of corrosion and ion migration in a connection portion between the electrode and the connecting member can be reduced. Moreover, the occurrence of corrosion and ion migration of a wiring in a multilayered wiring layer can be reduced. Thus, according to the method according to the example of the present disclosure, a semiconductor device having an improved reliability of connection between electrodes can be fabricated.

According to the semiconductor device and its fabrication method according to the example of the present disclosure, the first resin layer is present only at portions required for bonding electrodes with each other. Therefore, the amount and concentration of overall flux remaining between solder bumps are reduced as compared to those in conventional semiconductor devices and their fabrication methods. Therefore, even when electrodes and substrate electrodes which have a narrow pitch are bonded with each other, the occurrence of phenomena, such as corrosion at high temperature and humidity and migration during high-temperature and high-humidity biasing, is reduced or avoided, resulting in high connection reliability.

DETAILED DESCRIPTION

Embodiments of the present disclosure will be described hereinafter with reference to the accompanying drawings.

(First Embodiment)

Figure 1:
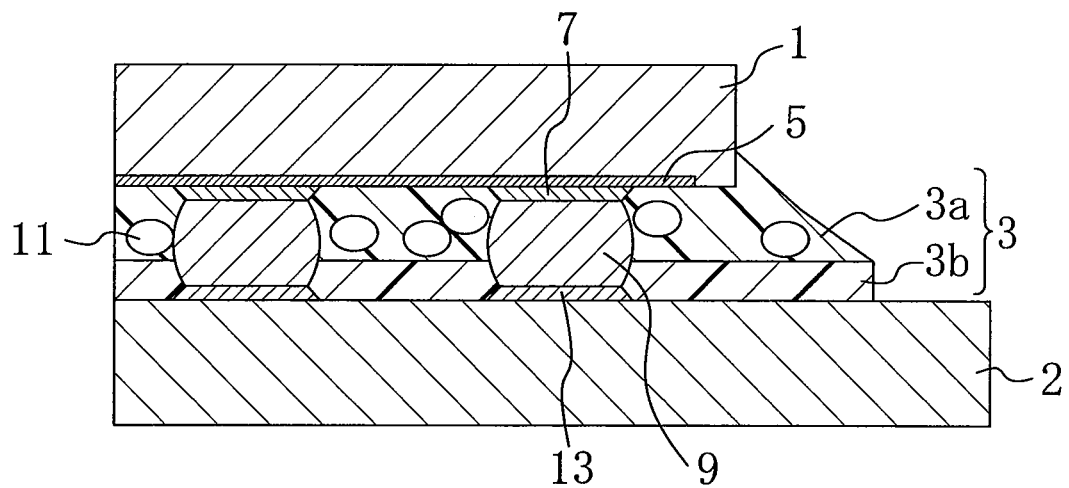
FIG. 1 is a cross-sectional view schematically showing a solder bonding portion in a semiconductor device according to a first embodiment of the present disclosure.

FIG. 1 is a cross-sectional view schematically showing a solder bonding portion in a semiconductor device according to a first embodiment of the present disclosure.

As shown in FIG. 1, the semiconductor device of this embodiment includes: a substrate 2 including substrate electrodes 13 provided on an upper surface thereof; a semiconductor element (first electronic part) 1 including a multilayered wiring layer 5 formed on a circuit-formed surface thereof and electrode terminals 7 formed on the multilayered wiring layer 5, the semiconductor element 1 being mounted on the substrate 2 with the circuit-formed surface facing the upper surface of the substrate 2; a sealing film (sealing material) 3 which fills a void between the substrate 2 and the semiconductor element 1 and in which fillers 11 are dispersed; and solder bumps 9 which penetrate the sealing film 3 to electrically connect the electrode terminals 7 with the respective substrate electrodes 13. The substrate 2 may be a circuit substrate, such as a glass epoxy multilayer substrate, an aramid multilayer substrate or the like, or alternatively, a silicon substrate. The electrode terminals 7, the substrate electrodes 13 and the solder bumps 9 are each arranged two-dimensionally. The multilayered wiring layer 5 includes, for example, a minute wiring layer and a brittle low-dielectric constant insulating film (e.g., a low-k layer or an ultra low-k layer). The filler 11 is made of an inorganic material such as alumina, silica or the like, an organic material such as a resin ball or the like, or the like.

The sealing film 3, which contains flux, includes a first resin layer 3b which is provided on the upper surface of the substrate 2, and a second resin layer 3a which is provided between the first resin layer 3b and the circuit-formed surface of the semiconductor element 1 and has a lower flux concentration than that of at least the first resin layer 3b. An example where the second resin layer 3a does not contain flux will be described hereinafter.

The sealing film 3 is made of a base resin, such as an epoxy resin, an acrylic resin, a phenol resin or the like, and a curing agent and an additive. The first resin layer 3b contains flux. Note that the second resin layer 3a and the first resin layer 3b may or may not have the same composition of the resin component other than flux.

FIGS. 2A-2C are cross-sectional views showing a method for fabricating the semiconductor device of this embodiment of FIG. 1. The fabrication method will be described hereinafter.

Initially, in a step shown in FIG. 2A, the semiconductor element 1 including the multilayered wiring layer 5 and the electrode terminals 7 arranged two-dimensionally which are successively formed on the circuit-formed surface of the semiconductor substrate, and the substrate 2 including the substrate electrodes 13 arranged two-dimensionally on the upper surface, are prepared. Next, the solder bumps 9 are formed on the electrode terminals 7. The solder bumps 9 may be formed by any method, such as screen printing, plating or the like. Alternatively, the solder bumps 9 may be formed by providing solder balls on the electrode terminal 7 on which flux has been supplied, and putting the substrate into a reflow furnace. Note that the solder bump 9 is made of, for example, SnAg, SnAgCu, SnZn, SnZnBi, SnPb, SnBi, SnAgBiIn or the like.

Next, the sealing film 3 including the first resin layer 3b and the second resin layer 3a is prepared. The sealing film 3 is joined with the upper surface of the substrate 2 so that the upper surface of the substrate 2 contacts the first resin layer 3b. In this case, pressure is applied using a roller or the like at room temperature or while heating.

Next, in a step shown in FIG. 2B, pressure is applied to the semiconductor element 1 while the semiconductor element 1 is heated to a temperature at which the solder bump is not melted, thereby performing heat pressure bonding. In this case, it is preferable that at least a top portion of the solder bump 9 break through the second resin layer 3a and reside in the first resin layer 3b. If pressure is applied so that the solder bump 9 reaches the substrate electrode 13, solder bonding is more easily achieved.

Next, in a step shown in FIG. 2C, the temperature of the resultant semiconductor device is increased to a temperature higher than or equal to the melting point (e.g., 240° C.) of the solder, and heating is continued so that the flux component of the first resin layer 3b is activated and the solder bumps 9 are melted before the solder bumps 9 are diffusion-bonded with the substrate electrodes 13. Note that the substrate electrode 13 may be made of a metal material, such as AuNiCu, Cu or the like.

Next, heating is still continued so that the sealing film 3 starts a curing reaction. Thereafter, the semiconductor device is cooled to a temperature lower than or equal to the freezing point of the solder. As a result, the electrode terminals 7 are completely connected with the substrate electrodes 13 by the solder bumps 9. Note that heating is also desirably performed at a temperature lower than the melting point of the solder after the formation of the connection. This heating process promotes the curing reaction of the sealing film 3, resulting in higher reliability.

In the semiconductor device of this embodiment and its fabrication method, as described above, the sealing film 3 includes the first resin layer 3b which contains flux and the second resin layer 3a which does not contain flux (or contains a low concentration of flux). In the steps of FIGS. 2B and 2C, the substrate electrode 13 and the solder bumps 9 are bonded with each other while the substrate electrode 13 is covered with the first resin layer 3b containing flux, whereby the formation of an oxide film on the bonding surface can be reduced, and even if the solder does not contain lead, the substrate electrode 13 and the solder bumps 9 can be bonded with each other with sufficient strength.

Moreover, the connection portion between the solder bump 9 and the electrode terminal 7 is covered with the second resin layer 3a which does not contain flux, and therefore, corrosion by an active agent contained in flux does not occur in the connection portion between the solder bump 9 and the electrode terminal 7, and the occurrence of ion migration is also reduced. Moreover, the multilayered wiring layer 5 does not contact the first resin layer 3b containing flux, and therefore, even when a low-dielectric constant film is used as the interlayer insulating film, impregnation of the low-dielectric constant film with the active agent in flux can be reduced, whereby the occurrence of corrosion and ion migration of minute wirings can be reduced.

Moreover, in the step of FIG. 2A, the sheet-like sealing film 3 is used. Therefore, even when the size of circuitry on the semiconductor element 1 is reduced and therefore the pitch between the electrode terminals 7 is narrowed, the amount of the sealing resin can be easily controlled and therefore the resin flowing around to the back surface of the semiconductor element 1 can be reduced. Note that the sealing film 3 has a thickness of 40-80 μm, and the first resin layer 3b has a thickness of 10-30 μm. Thus, the semiconductor device of this embodiment has a high connection reliability even when the size thereof is reduced, as compared to that of conventional semiconductor devices.

EXAMPLES

An example of the aforementioned fabrication method will be described hereinafter.

Here, electrode terminals were connected with each other using the following materials.

| | |
|---|---|
| Solder bump | pitch: 120 µm, height: 60 µm, two dimensional (area) arrangement $Sn_3Ag_{0.5}Cu$ melting point: 220° C. |
| Multilayered wiring layer: | 6-mm square (6 mm × 6 mm), thickness 200 µm ultra-low-k: 45-nm wiring |
| Substrate: | 15-mm square (15 mm × 15 mm), thickness 350 µm, glass epoxy |
| Substrate electrode: | Au—Ni—Cu 15 µm thick |
| Sealing film | |
| Second resin layer: | containing an epoxy resin, a curing agent and silica film thickness: 60 µm thick |
| First resin layer: | containing an epoxy resin, a curing agent, a flux component (carboxylic acid) and silica 20 µm thick |

The aforementioned materials were used to fabricate a semiconductor device by the aforementioned fabrication method. A cross-section of the semiconductor device was analyzed after polishing. As a result, it was observed that the solder bonding portion and the substrate electrode 13 were covered with the first resin layer 3b, and a good bonding state was obtained. Moreover, in a high-temperature and high-humidity test, a stable connection resistance was obtained at 1000 cyc (cycles) at a temperature of 85° C. and a humidity of 85%.

Thus, according to the method of this embodiment, the flux concentration of the entire sealing resin can be reduced by supplying a resin containing flux to a local portion requiring it, whereby high connection reliability can be ensured.

Note that, in the semiconductor device of this embodiment, it is particularly preferable that the second resin layer 3a do not contain flux. However, if the second resin layer 3a contains a lower concentration of flux than that of the first resin layer 3b, the effect of improving the connection reliability is obtained.

Moreover, although it has been described as an example in this embodiment that the sealing film 3 is used as the sealing material, the sealing material is not limited to film. For example, a liquid sealing material can be used instead of the sealing film 3. A first liquid resin which contains flux may be applied before a second liquid resin which does not contain flux may be applied onto the first liquid resin. In this case, advantages similar to those of this embodiment can be obtained.

—Variation of First Embodiment—

Figure 2:
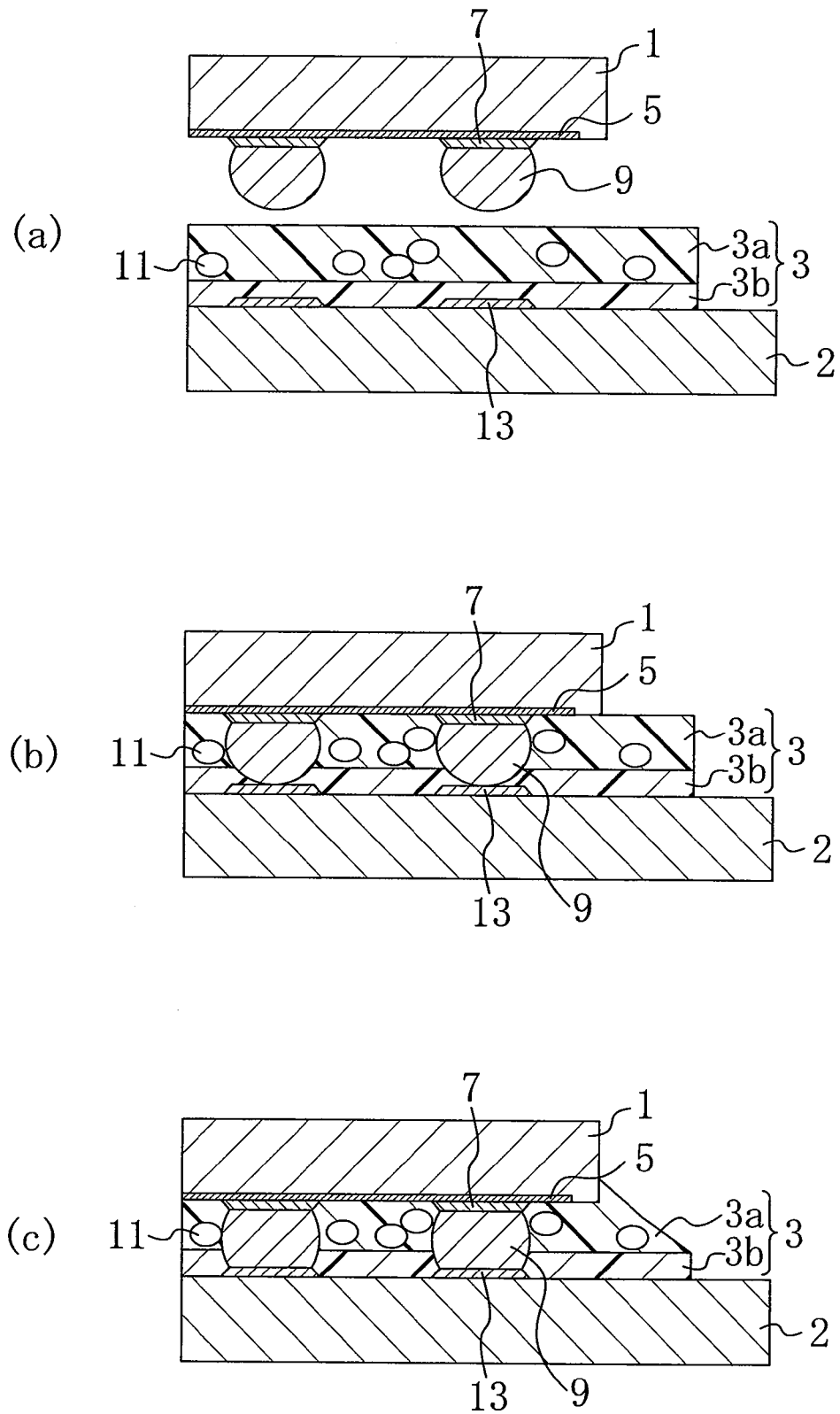
FIGS. 2A-2C are cross-sectional views showing a method for fabricating the semiconductor device of the first embodiment of FIG. 1.
Figure 3:
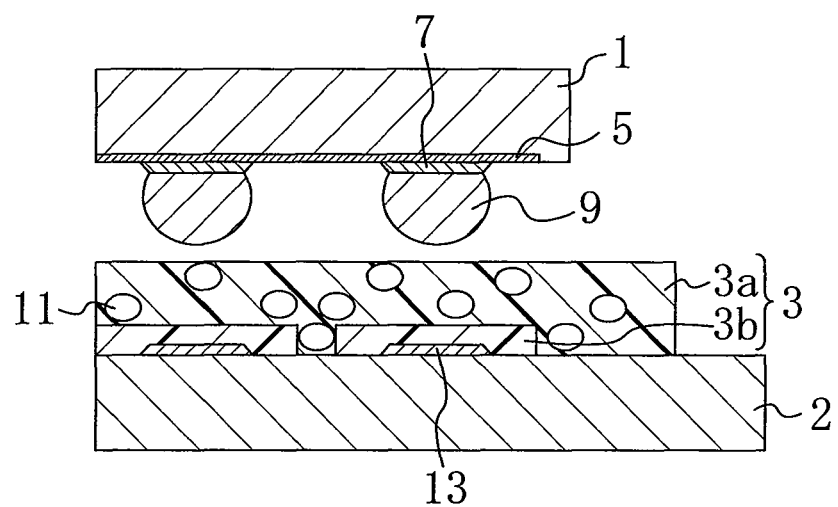
FIG. 3 is a cross-sectional view of a variation of the method for fabricating the semiconductor device of the first embodiment.

FIG. 3 is a cross-sectional view of a variation of the method for fabricating the semiconductor device of the first embodiment. In FIG. 3, the same parts as those of FIGS. 1 and 2 are indicated by the same reference characters.

As shown in FIG. 3, in the method of this variation, a step corresponding to FIG. 2A includes providing a first resin layer (first resin portion) 3b containing flux only on substrate electrodes 13 and a substrate 2 in a vicinity of the substrate electrodes 13. Note that, in this step, a sealing film 3 including the first resin layer 3b and a second resin layer (second resin portion) 3a is previously prepared before being mounted onto the substrate 2. When the sealing film 3 is mounted onto the substrate 2, positioning is performed so that portions of the sealing film 3 in which the first resin layer 3b is provided coincide with the substrate electrodes 13.

Thereafter, pressure is applied onto the semiconductor element 1 in a manner similar to that of the first embodiment so that the substrate electrodes 13 are connected with solder bumps 9.

According to this method, the solder bumps 9 and the substrate electrodes 13 can be connected with each other while the substrate electrodes 13 are covered with the first resin layer 3b containing flux, whereby the connection reliability of the solder bumps 9 and the substrate electrodes 13 is enhanced. Moreover, the amount of flux contained in the sealing film 3 can be reduced as compared to that in the method of the first embodiment, and therefore, the occurrence of corrosion and ion migration of the connection portions between the electrode terminals 7 and the solder bumps 9 can be more reliably reduced, and the occurrence of corrosion and ion migration of wirings in the multilayered wiring layer 5 can also be more reliably reduced.

(Second Embodiment)

Figure 4:
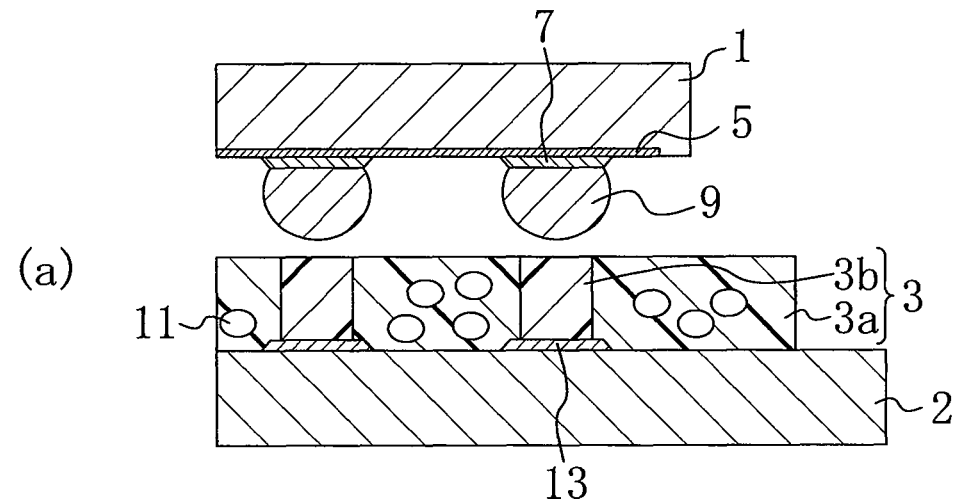
FIGS. 4A-4C are cross-sectional views schematically showing a method for fabricating a semiconductor device according to a second embodiment of the present disclosure.
Figure 4:
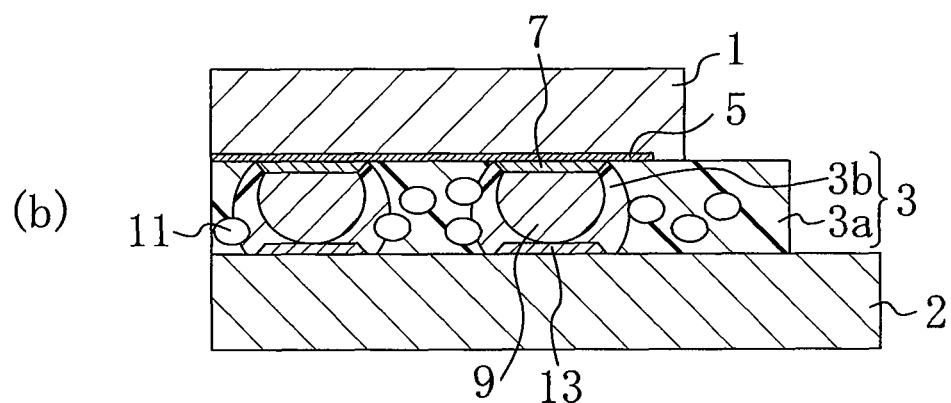
Figure 4:
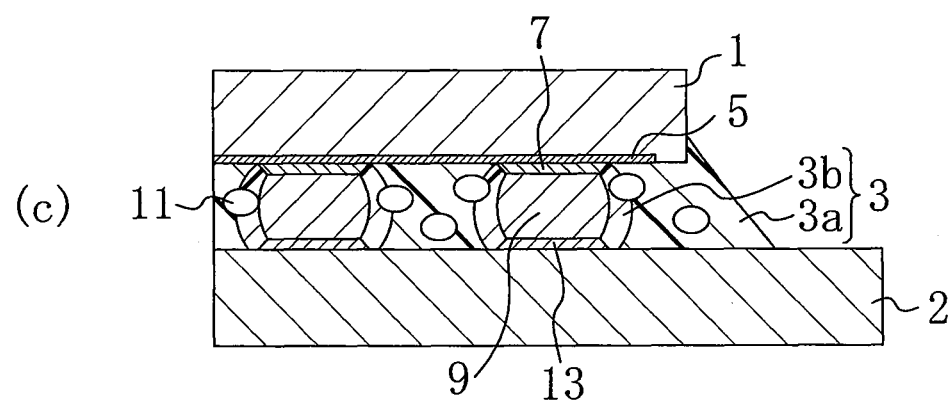
Figure 5:
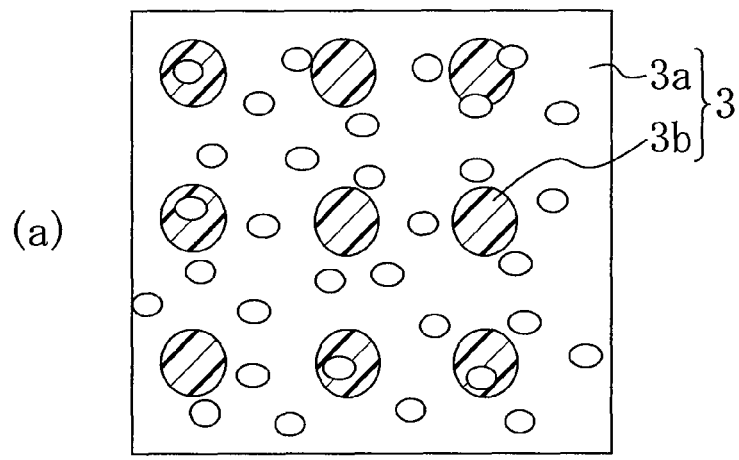
FIGS. 5A-5C are plan views schematically showing a structure of a sealing film of the semiconductor device of the second embodiment.
Figure 5:
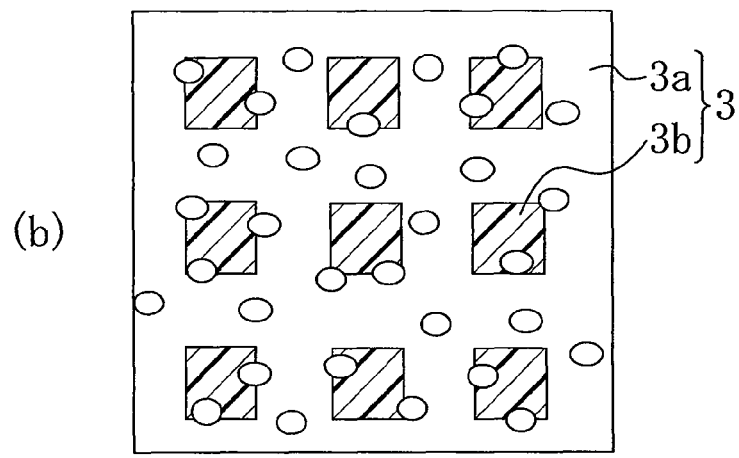
Figure 5:
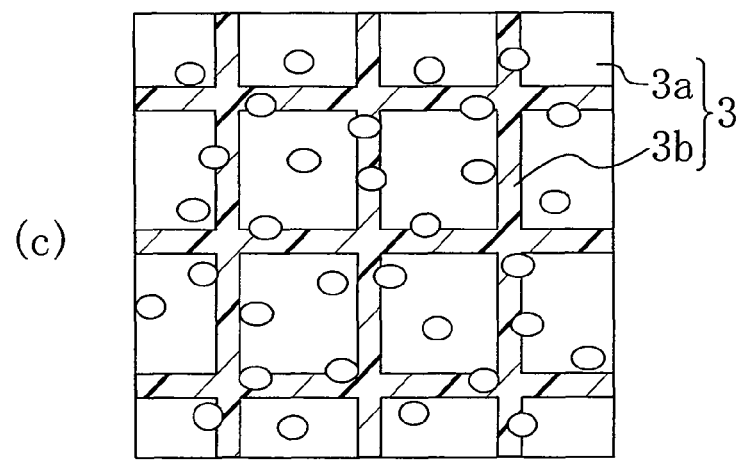

FIGS. 4A-4C are cross-sectional views schematically showing a method for fabricating a semiconductor device according to a second embodiment of the present disclosure. FIGS. 5A-5C are plan views schematically showing a structure of a sealing film of the semiconductor device of the second embodiment. The fabrication method of this embodiment will be described hereinafter.

Initially, in a step shown in FIG. 4A, a semiconductor element 1 including a multilayered wiring layer 5 and electrode terminals 7 arranged two-dimensionally which are successively formed on a circuit-formed surface of a semiconductor substrate, and a substrate 2 including substrate electrodes 13 arranged two-dimensionally on an upper surface thereof, are prepared. Next, solder bumps 9 are formed on the electrode terminals 7. Next, a sealing film 3 including a first resin layer 3b and a second resin layer 3a is prepared. The sealing film 3 is joined with the upper surface of the substrate 2 so that the upper surface of the substrate 2 contacts the first resin layer 3b. In this case, pressure is applied using a roller or the like at room temperature or while heating. Here, the sealing film 3 used in this step is different from that of the first embodiment in that it includes the second resin layer 3a, and the first resin layer 3b which penetrates through the second resin layer 3a and is arranged two-dimensionally so that it coincides with positions of the substrate electrodes 13 and the electrode terminals 7 as viewed from at least the top. The first resin layer 3b contains flux, and the second resin layer 3a does not contain flux. Note that the shape as viewed from the top of the first resin layer 3b is not limited to any particular shape, and may be of a circle, a quadrangle, or a grid as shown in FIGS. 5A-5C, or alternatively, a doughnut or the like.

Next, in a step shown in FIG. 4B, the sealing film 3 is joined with the upper surface of the substrate 2 so that the first resin layer 3b of the sealing film 3 coincides with the positions of the substrate electrodes 13. Next, the semiconductor element 1 is bonded with the substrate 2 by pressure. In this step, the semiconductor element 1 is pushed so that the first resin layer 3b directly below the solder bumps 9 is pressed and spread by the solder bumps 9, and the solder bumps 9 then reach the substrate electrodes 13.

Next, in a step shown in FIG. 4C, the temperature of the resultant semiconductor device is increased to a temperature higher than or equal to the melting point (e.g., 240° C.) of the solder, and heating is continued so that the substrate electrodes 13 and the electrode terminals 7 are bonded with each other by the solder. This heating activates flux in the first resin layer 3b, and therefore, an oxide film on the solder bumps 9 and contaminants on the substrate electrodes 13 are removed, whereby the solder bumps 9 and the substrate electrodes 13 can be reliably connected with each other. Thereafter, the semiconductor device is placed in an oven or the like again and is then heated, for example, at 150° C. for about 30 minutes to about 2 hours so that a component of the sealing film 3 which is to be cured is cured. In the semiconductor device thus fabricated, the first resin layer 3*b* containing flux is provided, surrounding the substrate electrodes 13, the solder bumps 9 and the electrode terminals 7.

The fabrication method of this embodiment can also reduce the overall amount and concentration of flux contained in the sealing film 3 as compared to the conventional art, as with the method of the first embodiment. Therefore, the active agent concentration of the flux can be reduced, whereby the connection reliability between the substrate electrodes 13 and the electrode terminals 7 by the solder bumps 9 can be improved.

Note that the aforementioned advantages can be obtained even if the second resin layer 3*a* contains a lower concentration of flux than that of the first resin layer 3*b*.

(Third Embodiment)

Figure 6:
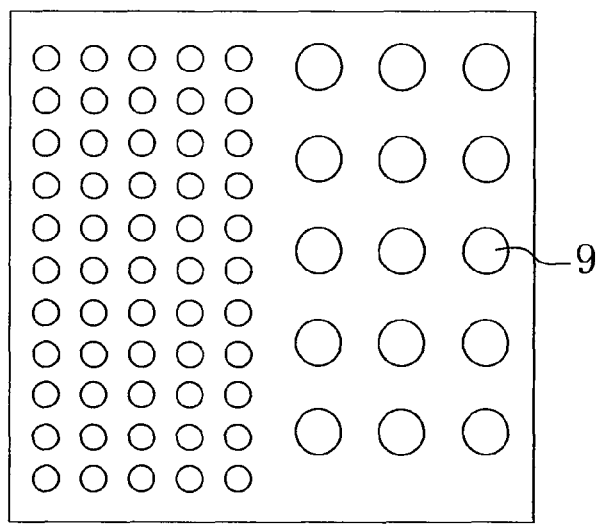
FIG. 6A is a plan view schematically showing a semiconductor device in a semiconductor device according to a third embodiment of the present disclosure.
FIG. 6B is a cross-sectional view schematically showing the semiconductor device of the third embodiment.
Figure 6:
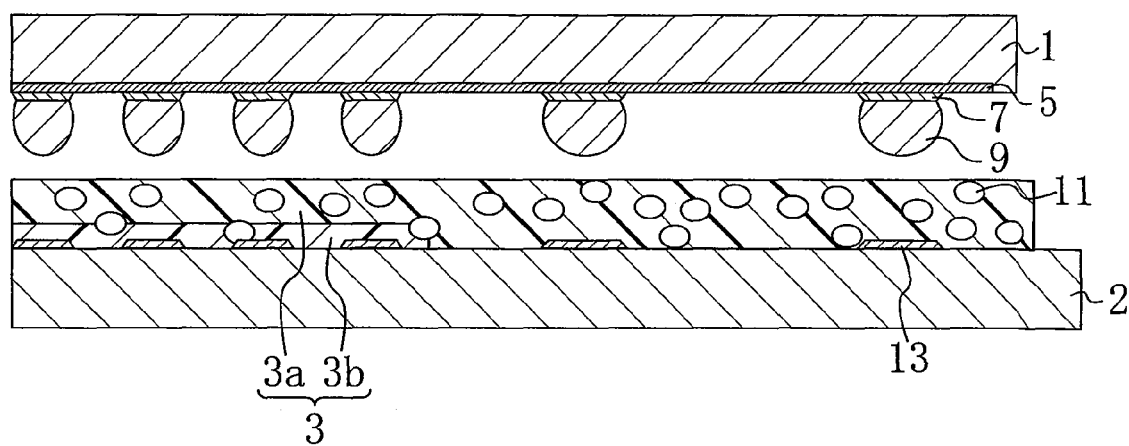

FIG. 6A is a plan view schematically showing a semiconductor element in a semiconductor device according to a third embodiment of the present disclosure. FIG. 6B is a cross-sectional view schematically showing the semiconductor device of the third embodiment.

As shown in FIG. 6A, in the semiconductor device of this embodiment, the semiconductor element 1 has a region having a narrow pitch of electrode terminals 7 and a region having a broad pitch of electrode terminals 7. For example, there are a region in which the pitch of electrode terminals 7 is 100 μm and a region in which the pitch of electrode terminals 7 is 200 μm. In the region having the narrow pitch of electrode terminals 7, an area as viewed from the top of each electrode terminal 7 is smaller than that in the region having the broad pitch of electrode terminals 7.

Moreover, as shown in FIG. 6B, in the region having the narrow pitch of electrode terminals 7, a sealing film 3 has a double-layer structure including a first resin layer 3*b* which contains flux and a second resin layer 3*a* which does not contain flux, and an entire region in which the electrode terminals 7 are provided is covered directly with the first resin layer 3*b*. In contrast to this, in the region having the broad pitch of electrode terminals 7, the sealing film 3 has a single-layer structure including only the second resin layer 3*a*.

In the region having the narrow pitch of electrode terminals 7, the areas as viewed from the top of the electrode terminal 7 and the substrate electrode 13 connected therewith are also small, and therefore, it is difficult to reliably bond the solder bump 9 with the substrate electrode 13 unless flux is used. On the other hand, in the region having the broad pitch of electrode terminals 7, the areas as viewed from the top of the electrode terminal 7 and the substrate electrode 13 connected therewith are large, and therefore, flux does not have to be necessarily used to bond the solder bump 9 with the substrate electrode 13. Therefore, according to the semiconductor device of this embodiment, it is possible to reduce the degradation of the connection reliability of the electrode terminals 7 and the substrate electrodes 13 both in the region having the narrow pitch of electrode terminals 7 and in the region having the broad pitch of electrode terminals 7. Moreover, the amount of flux in the sealing film 3 can be reduced as compared to that in conventional techniques. Therefore, it is possible to reduce the occurrence of corrosion and ion migration in a connection portion between the electrode terminal 7 and the solder bump 9 and a connection portion between the solder bump 9 and the substrate electrode 13 even when the portions are exposed to high temperature, high pressure or the like during fabrication. Moreover, it is possible to reduce the occurrence of corrosion and ion migration of wirings in the multilayered wiring layer 5.

Although it has been assumed in this embodiment that the sealing film 3 has a double-layer structure over the entire region having the narrow pitch of electrode terminals 7, the structure of the sealing film 3 is not limited to this. In the region having the narrow pitch of electrode terminals 7, the first resin layer 3*b* may be provided, covering separately the upper surfaces of the substrate electrodes 13 at a pitch equal to the pitch of the electrode terminals 7 and the substrate electrodes 13.

(Fourth Embodiment)

Figure 7:
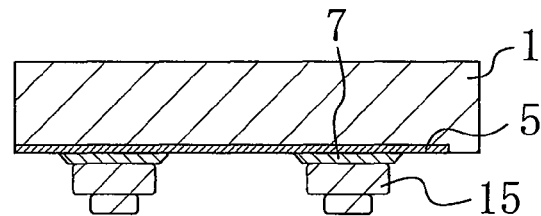
FIGS. 7A-7C are cross-sectional views schematically showing a method for fabricating a semiconductor device according to a fourth embodiment of the present disclosure.
Figure 7:
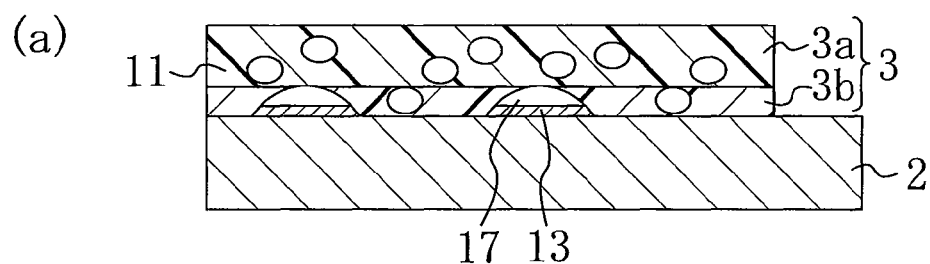
Figure 7:
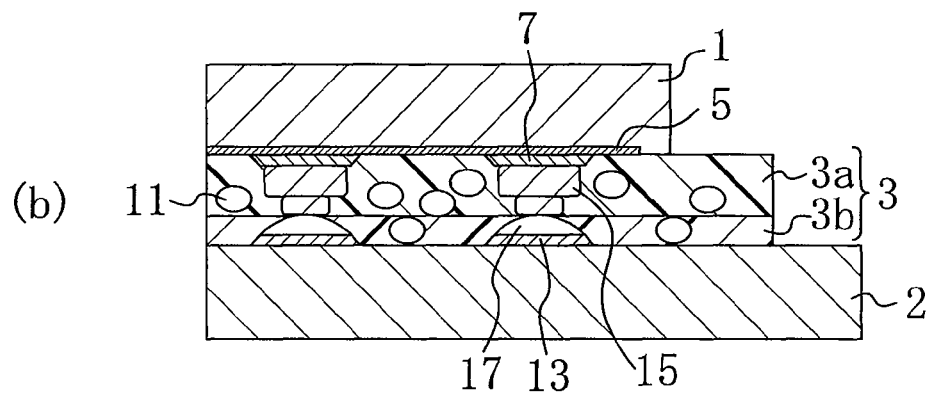
Figure 7:
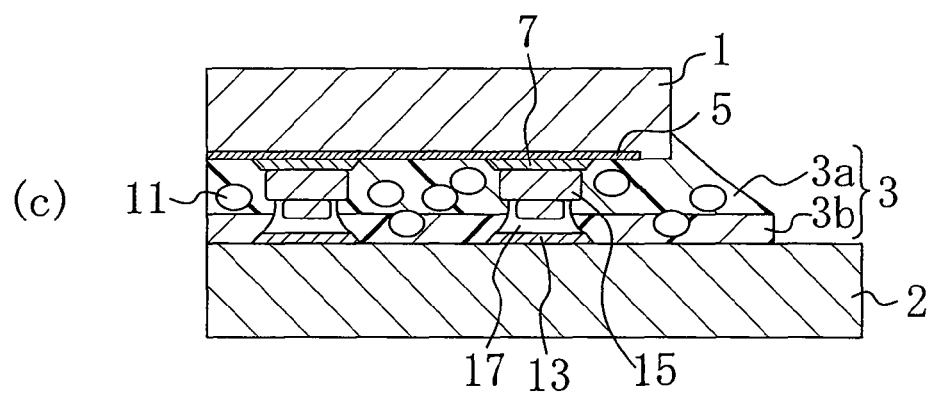

FIGS. 7A-7C are cross-sectional views schematically showing a method for fabricating a semiconductor device according to a fourth embodiment of the present disclosure.

In the method for fabricating the semiconductor device of this embodiment, protruding bumps 15 are formed on electrode terminals 7 of a semiconductor element 1, and solder bumps 17 are formed on substrate electrodes 13 before bonding. The protruding bump 15 may be made of, for example, gold, copper, a gold-coated resin or the like, and may be formed by means, such as plating, dispensing, wire bonding or the like. The semiconductor device of this embodiment will be fabricated by the following method.

Initially, in a step shown in FIG. 7A, a sealing film 3 is joined with an upper surface of a substrate 2 so that a first resin layer 3*b* contacts the upper surface of the substrate 2 and covers the solder bumps 17.

Next, in a step shown in FIG. 7B, by performing heating and pressing from a back surface of the semiconductor element 1, the protruding bumps 15 are caused to break through the sealing film 3 and press themselves against the solder bumps 17.

Next, in a step shown in FIG. 7C, the temperature of the resultant semiconductor device is increased to a temperature higher than or equal to the melting point of the solder so that flux is activated, thereby removing an oxide film and contaminants on surfaces of the protruding bumps 15, the solder bumps 17 and the substrate electrodes 13. Moreover, the solder bumps 17 are melted so that the protruding bumps 15 are wet with the solder, thereby electrically and physically bonding the solder bumps 17 with the protruding bumps 15. Next, after being temporarily cooled, the sealing film 3 is heated again to be cured. When the sealing film 3 is sufficiently cured in the electrode bonding step, this step of curing the sealing film 3 may be omitted.

Although it has been described in this embodiment that the sealing film 3 includes the first resin layer 3*b* and the second resin layer 3*a* which are laminated, the structure of the sealing film 3 is not limited to this. As described in the second embodiment, the first resin layer 3*b* may be provided at a pitch equal to that of electrodes only in a region having a narrow pitch of electrodes.

Also in the method for fabricating the semiconductor device of this embodiment, flux can be stably supplied to a solder bonding portion which essentially requires the presence of flux, and the amount and concentration of an active agent contained in the entire sealing film 3 can be reduced, resulting in high connection reliability.

(Fifth Embodiment)

Figure 8:
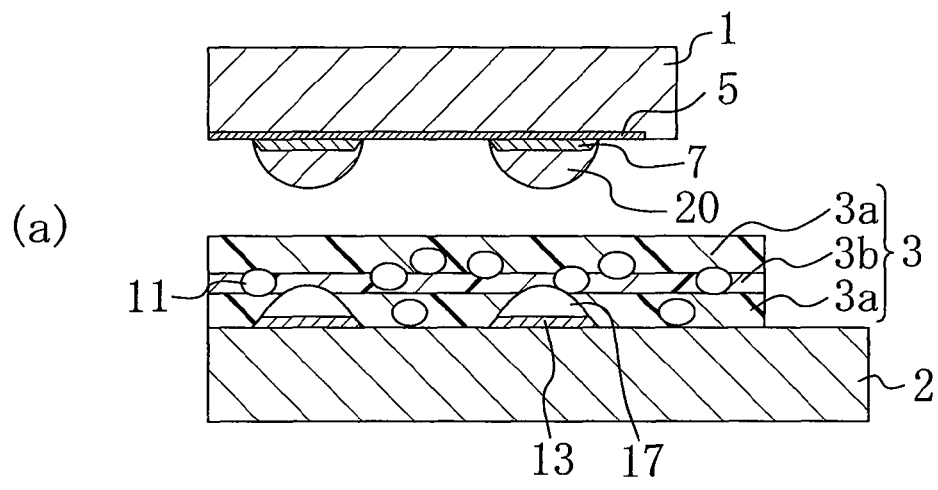
FIGS. 8A-8C are cross-sectional views schematically showing a method for fabricating a semiconductor device according to a fifth embodiment of the present disclosure.
Figure 8:
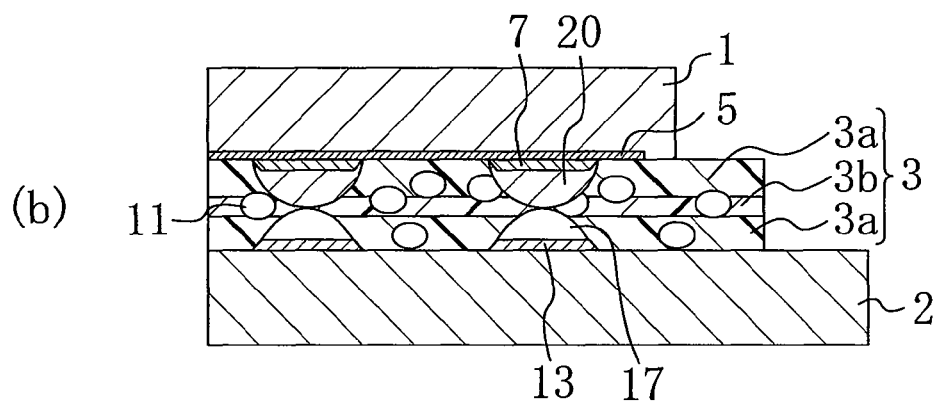
Figure 8:
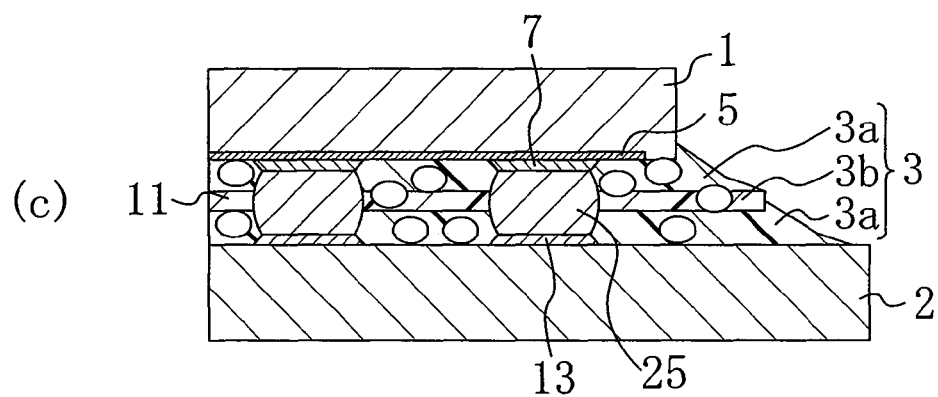

FIGS. 8A-8C are cross-sectional views schematically showing a method for fabricating a semiconductor device according to a fifth embodiment of the present disclosure. Solder bumps 20 are formed on electrode terminals 7 of a semiconductor element 1 used in the method of this embodiment. Moreover, a sealing film 3 has a triple-layer structure in which a first resin layer 3*b* containing flux is interposed between two second resin layers 3a. The semiconductor device of this embodiment is fabricated by the following method.

Initially, in a step shown in FIG. 8A, the sealing film 3 including the three layers is joined with an upper surface of a substrate 2. Note that it is desirable that the thicknesses of the layers included in the sealing film 3 be designed so that a top portion of the solder bump 17 resides in the first resin layer 3b when the sealing film 3 is joined with the substrate 2.

Next, in a step shown in FIG. 8B, heat and pressure are applied to the semiconductor element 1 to push the semiconductor element 1 so that a top portion of the solder bump 20 contacts a top portion of the solder bump 17.

Next, in a step shown in FIG. 8C, the temperature of the resultant semiconductor device is increased to a temperature higher than or equal to the melting point of the solder so that flux is activated, and the solder bumps 20 and the solder bumps 17 are melted. Next, cooling is performed to form solder bonding portions 25. Next, after cooling, the sealing film 3 is heated again to be cured. Note that, when the sealing film 3 is sufficiently cured in the bonding step, this step of curing the sealing film 3 may be omitted.

Also in the method of this embodiment, flux can be stably supplied to the solder bonding portions which essentially require the presence of flux, and the amount and concentration of an active agent contained in the entire sealing film 3 can be reduced, resulting in high connection reliability.

Although a semiconductor element and a circuit substrate have been described as example electronic parts in the aforementioned embodiments, electronic parts to which the present disclosure is applicable are not limited to these. Also for passive parts, such as a capacitor, a coil, a resistor and the like, which have a narrow pitch of electrode terminals, advantages similar to those of the methods of the aforementioned embodiments can be obtained by using a resin film partially including a resin layer containing flux.

Moreover, in the electronic apparatuses (semiconductor devices) described in the aforementioned embodiments, an electronic part and an electrode of a substrate are connected with each other by a connecting member, such as solder or the like, and a space between the electronic part and the substrate is filled with a sealing film. At least a portion of the connecting member needs to contact a portion of the sealing film which contains flux.

(Sixth Embodiment)

Figure 9:
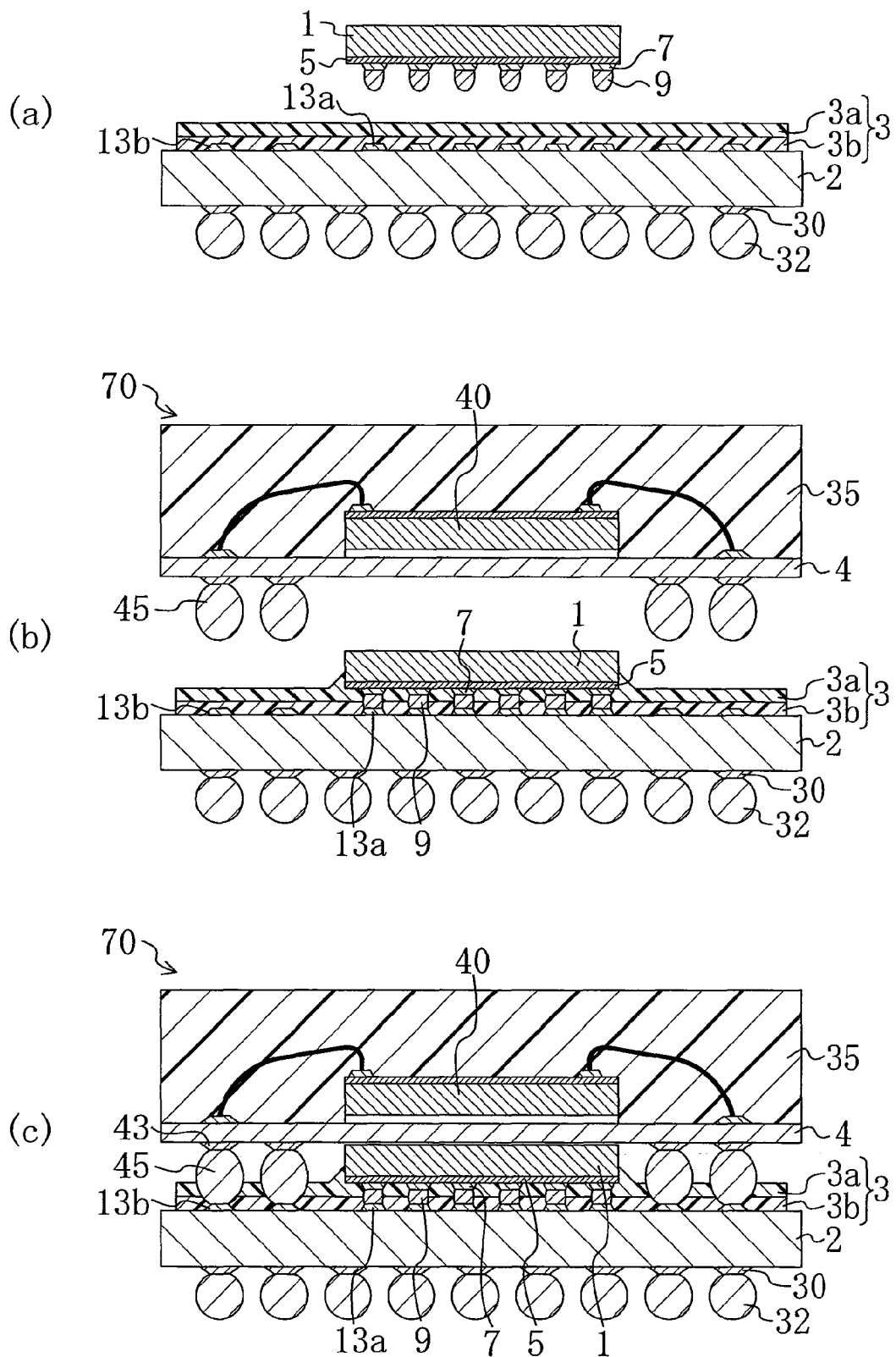
FIGS. 9A-9C are cross-sectional views showing a method for fabricating a semiconductor device according to a sixth embodiment of the present disclosure.

FIGS. 9A-9C are cross-sectional views showing a method for fabricating a semiconductor device according to a sixth embodiment of the present disclosure. The semiconductor device has a so-called package-on-package structure in which two or more packages including a semiconductor element are stacked. The method will be described hereinafter.

Initially, in a step shown in FIG. 9A, a semiconductor element 1 including a multilayered wiring layer 5, electrode terminals 7 arranged two-dimensionally, and solder bumps (solder electrodes) 9 which are successively formed on a circuit-formed surface of a semiconductor substrate, and a substrate 2 including substrate electrodes 13a and 13b arranged two-dimensionally on an upper surface thereof, are prepared. Electrode terminals 30 and solder bumps 32 connected with the electrode terminals 30 are formed on a back surface of the substrate 2, and a sealing film 3 including a first resin layer 3b and a second resin layer 3a is joined with the entire upper surface of the substrate 2. The first resin layer 3b contains flux, and the second resin layer 3a does not contain flux. Note that the second resin layer 3a may contain a lower concentration of flux than that of the first resin layer 3b.

Next, in a step shown in FIG. 9B, the circuit-formed surface of the semiconductor element 1 is caused to face the upper surface of the substrate 2, and the substrate electrodes 13a provided in a middle portion of the upper surface of the substrate 2 are bonded with the solder bumps 9 by heating and pressing. The heat pressure bonding is performed by heating the semiconductor element 1 to a temperature at which the solder bump 9 is not melted and pressing the semiconductor element 1. As a result, the semiconductor element 1 is pushed so that the first resin layer 3b directly below the solder bumps 9 is pressed and spread by the solder bumps 9, and the solder bumps 9 then reach the substrate electrodes 13a.

Moreover, a semiconductor package 70 which includes a second substrate 4 including a second semiconductor element 40 provided on an upper surface thereof, and electrode terminals 43 and solder bumps 45 bonded therewith which are provided on a back surface thereof, and a sealing resin 35 sealing the second semiconductor element 40, is prepared. The electrode terminals 43 and the solder bumps 45 are provided in a peripheral region of the back surface of the second substrate 4. As with the substrate 2, the second substrate 4 may be a circuit substrate, such as a glass epoxy multilayer substrate, an aramid multilayer substrate or the like, or alternatively, a silicon substrate.

Next, in a step shown in FIG. 9C, the semiconductor package 70 is mounted onto the upper surface of the substrate 2 so that the back surface of the second substrate 4 faces the upper surface of the substrate 2. In this case, the solder bumps 45 are positioned to contact the substrate electrode 13b, and pressure is applied to the semiconductor package 70 while the semiconductor package 70 and the sealing film 3 are heated to a temperature at which the solder bump 45 is not melted. Next, the temperature of the solder bumps 45 and 9 are increased to a temperature higher than or equal to the melting point of the solder (e.g., 240° C.), and heating is continued so that a flux component of the first resin layer 3b is activated, and the solder bumps 45 and 9 are melted. Thereafter, the solder bumps 45 and 9 are diffusion-bonded with the substrate electrodes 13b and 13a, respectively. Note that the substrate electrodes 13a and 13b are made of a metal material, such as AuNiCu, Cu or the like. Subsequent steps of cooling the solder bumps 45 and 9 and curing the sealing film 3 are similar to those of the aforementioned embodiments and will not be described.

The semiconductor device of this embodiment fabricated by the aforementioned method includes: the substrate 2 including the substrate electrodes 13a and 13b which are provided on the upper surface thereof and the electrode terminals 30 and the solder bumps 32 to be bonded with an external apparatus which are provided on the back surface thereof; the semiconductor element 1 which includes the multilayered wiring layer 5 formed on the circuit-formed surface thereof, and the electrode terminals 7 formed on the multilayered wiring layer 5, and is mounted on the substrate 2 with the circuit-formed surface facing the upper surface of the substrate 2; the sealing film 3 which is provided on the entire upper surface of the substrate 2 and fills a void between the substrate 2 and the semiconductor element 1; and the solder bumps 9 which penetrate through the sealing film 3 to electrically connect the electrode terminals 7 with the substrate electrodes 13. The sealing film 3 includes the first resin layer 3b which contains flux and the second resin layer 3a which, for example, does not contain flux.

The semiconductor device of this embodiment further includes the semiconductor package 70 mounted on the upper surface of the substrate 2.

The semiconductor package 70 includes the second substrate 4 including the electrode terminals 43 and the solder bumps 45 provided on the back surface thereof, the second semiconductor element 40 provided on the upper surface of the second substrate 4, and the sealing resin 35 sealing the second semiconductor element 40 and the upper surface of the second substrate 4. The electrode terminals 43 and the substrate electrodes 13b are bonded with each other by the solder bumps 45. A circuit, such as a memory circuit, a logic circuit, a control circuit or the like, is provided on the second semiconductor element 40, and is electrically connected to the substrate electrodes 13b via electrode terminals provided on the upper surface of the second substrate 4, the electrode terminals 43 and the solder bumps 45.

According to the aforementioned semiconductor device of this embodiment and its fabrication method, the substrate electrodes 13a and the solder bumps 9 are bonded with each other while the substrate electrode 13a is covered with the first resin layer 3b containing flux. Therefore, it is possible to reduce the formation of an oxide film on the bonding surface, and bond the substrate electrodes 13a with the solder bumps 9 with sufficient strength even when the solder does not contain lead. As is similar to this, by bonding the substrate electrodes 13b with the solder bumps 45 while the substrate electrodes 13b are covered with the first resin layer 3b, the substrate electrodes 13b and the solder bumps 45 can be bonded with each other with sufficient strength.

Moreover, the connection portion between the solder bump 9 and the electrode terminal 7 is covered with the second resin layer 3a which does not contain flux. Therefore, it is possible to reduce or avoid corrosion which would otherwise occur in the connection portion between the solder bump 9 and the electrode terminal 7 due to an active agent contained in flux, and therefore, reduce the occurrence of ion migration.

Moreover, by using the sheet-like sealing film 3, the amount of flux supplied to the solder bumps 9 and 45 can be stabilized as compared to that in conventional techniques. Therefore, even if the number of the electrode terminals 7 is increased and therefore the pitch of the electrode terminals 7 is narrowed, electrical conduction via the solder bumps 9 and 45 can be more reliably established. Therefore, even in the so-called package-on-package structure, electrical conduction between packages can be reliably established, whereby the yield of the semiconductor device can be improved.

In addition to the aforementioned advantages, in the fabrication method of this embodiment, the solder bumps 9 and 45 are simultaneously melted in the step of FIG. 9C, whereby solder bonding between the electrode terminals 7 and the substrate electrodes 13a and solder bonding between the electrode terminals 43 and the substrate electrodes 13b are simultaneously performed. Such a so-called simultaneous reflow step allows fabrication of a semiconductor device by a smaller number of steps than when solder bonding is performed separately for each bonding portion. Therefore, equipment and time required for fabrication of a semiconductor device can be reduced.

Although FIGS. 9A-9C show an example in which a single semiconductor package is mounted on the substrate 2 on which the semiconductor element 1 has been mounted, a plurality of semiconductor packages may be stacked on the upper surface of the substrate 2 in the height direction. Also in this case, a thermal treatment for establishing conduction between each semiconductor package via solder bumps can be simultaneously performed, whereby the number of steps can be reduced.

Moreover, in the semiconductor device of this embodiment, for example, when the second substrate 4 is provided on the substrate 2, bonding portions between solder and electrodes need to contact the first resin layer 3b containing flux, and the overall space between an electronic part (e.g., the second substrate 4) and a substrate (the substrate 2) does not have to be filled with the sealing film 3.

(Seventh Embodiment)

Figure 10:
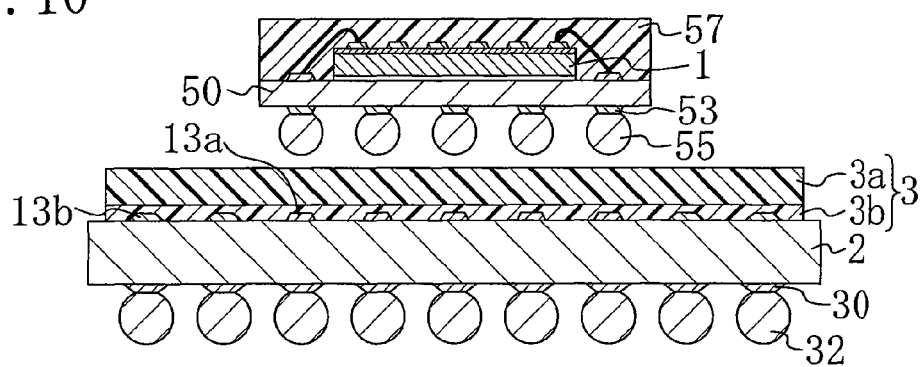
FIGS. 10A-10C are cross-sectional views showing a method for fabricating a semiconductor device according to a seventh embodiment of the present disclosure.
Figure 10:
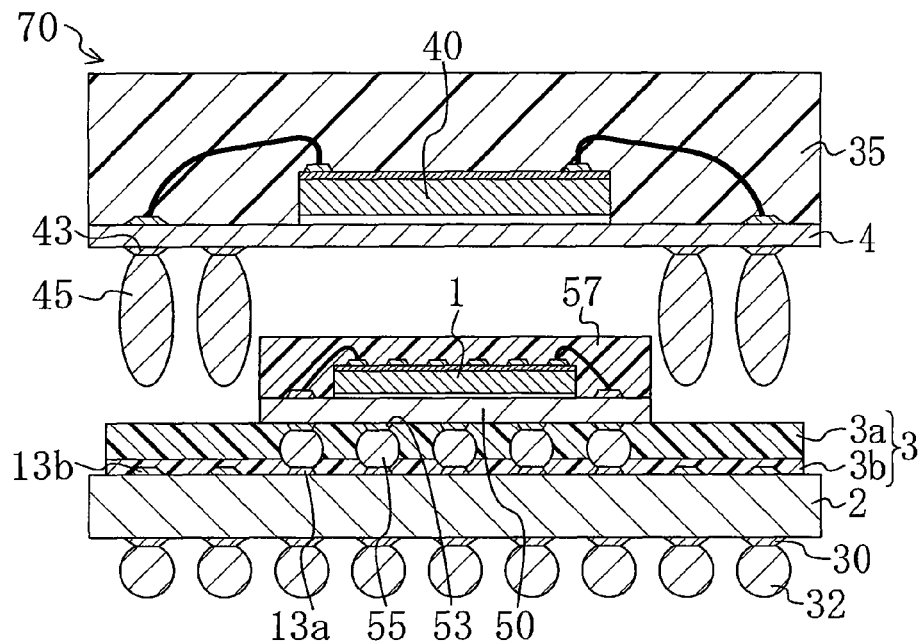
Figure 10:
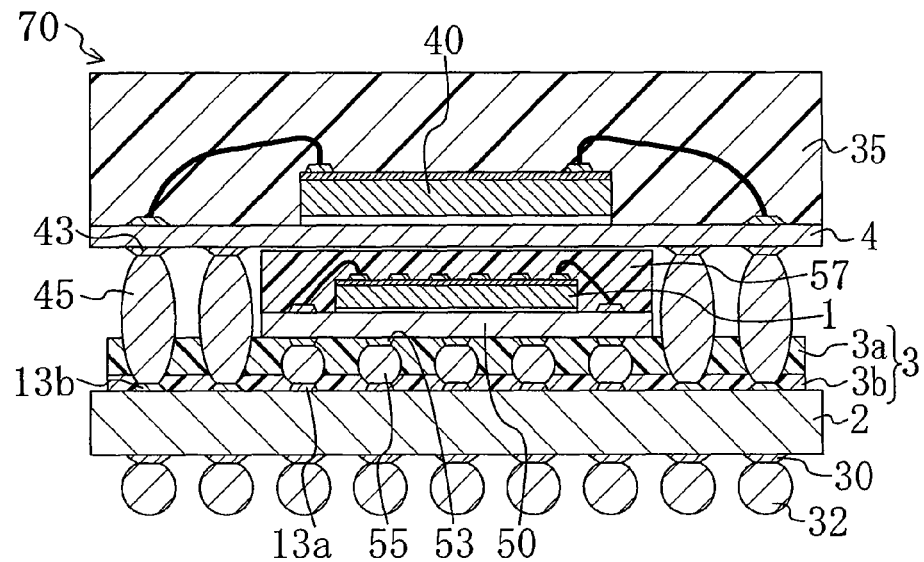

FIGS. 10A-10C are cross-sectional views showing a method for fabricating a semiconductor device according to a seventh embodiment of the present disclosure. An example semiconductor device having a package-on-package structure and its example fabrication method will be described hereinafter. Note that portions similar to those of the semiconductor device of the sixth embodiment will be described briefly or not at all.

Initially, in a step show in FIG. 10A, a third substrate 50 including a semiconductor element 1 mounted on an upper surface thereof and electrode terminals 53 and solder bumps 55 provided on a back surface thereof, and a substrate 2 including substrate electrodes 13a and 13b arranged two-dimensionally on an upper surface thereof, are prepared. Electrode terminals 30 and solder bumps 32 connected with the electrode terminals 30 are formed on a back surface of the substrate 2 here prepared, and a sealing film 3 including a first resin layer 3b and a second resin layer 3a is joined with the entire upper surface. The first resin layer 3b contains flux and the second resin layer 3a does not contain flux. Moreover, the upper surface of the third substrate 50 and the semiconductor element 1 are sealed with a sealing resin 57.

Next, in a step shown in FIG. 10B, the substrate electrodes 13a and the solder bumps 55 provided in a middle portion of the upper surface of the substrate 2 are bonded with each other by heating and pressing. In the heat pressure bonding, the third substrate 50 is heated to a temperature at which the solder bump 55 is not melted, and is then pressed against the substrate 2. Moreover, a semiconductor package 70 having a configuration similar to that of the sixth embodiment is prepared. Note that the solder bump 45 has a sufficient height so that, when it is connected with the substrate electrode 13b in a subsequent step, it can contact the substrate electrode 13b even if the third substrate 50 sealed with the resin is interposed between the substrate 2 and the second substrate 4.

Next, in a step shown in FIG. 10C, the second substrate 4 is mounted onto the upper surface of the substrate 2. In this case, the solder bumps 45 are positioned to contact the substrate electrodes 13b, and thereafter, pressure is applied to the semiconductor package 70 while the semiconductor package 70 and the sealing film 3 are heated to a temperature at which the solder bump 45 is not melted. Next, the temperature of the solder bumps 45 and 55 is increased to a temperature higher than or equal to the melting point of the solder (e.g., 240° C.), and heating is continued so that a flux component of the first resin layer 3b is activated, and the solder bumps 45 and 55 are melted. Thereafter, the solder bumps 45 and 55 are diffusion-bonded with the substrate electrodes 13b and 13a, respectively.

The semiconductor device of this embodiment fabricated by the aforementioned method is different from that of the sixth embodiment in that the semiconductor element 1 is not directly mounted on the upper surface of the substrate 2, and the third substrate 50 having an upper surface on which the semiconductor element 1 is provided and is sealed with a resin is mounted on the upper surface of the substrate 2.

In the semiconductor device of this embodiment, the substrate electrodes 13a and the solder bumps 55 are bonded with each other while the substrate electrodes 13a are covered with the first resin layer 3b containing flux, whereby the formation of an oxide film on the bonding surface can be reduced, and the substrate electrodes 13a and the solder bumps 55 can be diffusion-bonded with each other with sufficient strength even when the solder does not contain lead. As is similar to this, by diffusion-bonding the substrate electrodes 13b with the solder bumps 45 while the substrate electrodes 13b are covered with the first resin layer 3b, the substrate electrodes 13b and the solder bumps 45 can be bonded with each other with sufficient strength.

Moreover, connection portions between the solder bumps 55 and the electrode terminals 53 are covered with the second resin layer 3a which does not contain flux. Therefore, it is possible to reduce or avoid corrosion which would otherwise occur in the connection portions between the solder bumps 55 and the electrode terminals 53 due to an active agent contained in flux, and therefore, reduce the occurrence of ion migration.

Moreover, by using the sheet-like sealing film 3, the amount of flux supplied to the solder bumps 45 and 55 can be stabilized. Therefore, electrical conduction via the solder bumps 45 and 55 can be more reliably established. Therefore, even in the so-called package-on-package structure, electrical conduction between packages can be reliably established, whereby the yield of the semiconductor device can be improved.

In the fabrication method of this embodiment, the solder bumps 45 and 55 are simultaneously melted in the step of FIG. 10C, whereby solder bonding between the electrode terminals 53 and the substrate electrodes 13a and solder bonding between the electrode terminals 43 and the substrate electrodes 13b are simultaneously performed. Such a so-called simultaneous reflow step allows fabrication of a semiconductor device by a smaller number of steps than when solder bonding is performed separately for each connection portion. Therefore, equipment and time required for fabrication of a semiconductor device can be reduced.

As described above, even when the third substrate on which the semiconductor element 1 is mounted is provided on the substrate 2, the aforementioned advantages can be obtained by using the sealing film 3.

(Eighth Embodiment)

Figure 11:
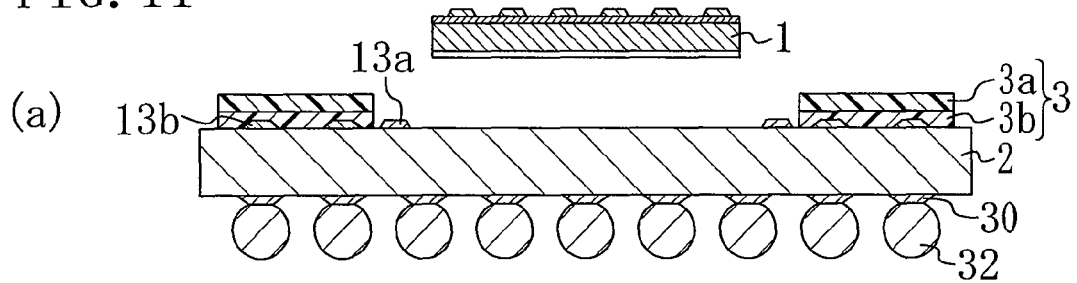
FIGS. 11A-11C are cross-sectional views showing a method for fabricating a semiconductor device according to an eighth embodiment of the present disclosure.
Figure 11:
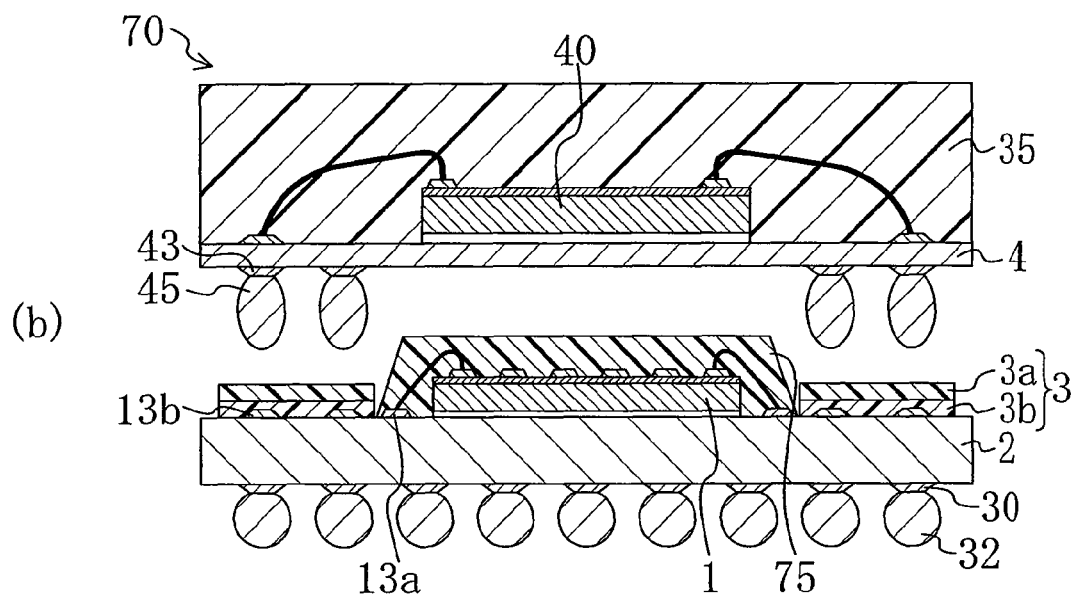
Figure 11:
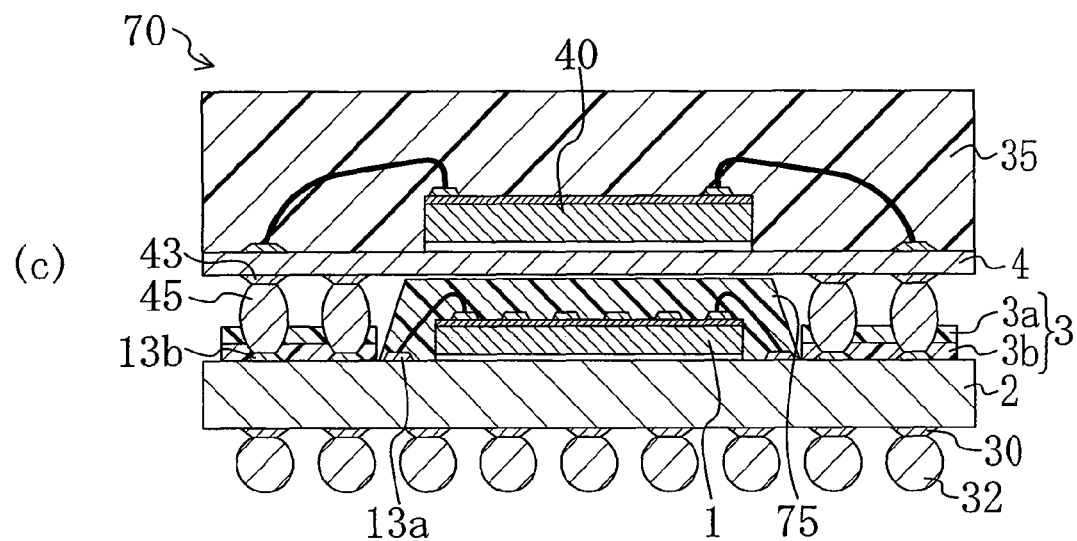
Figure 12:
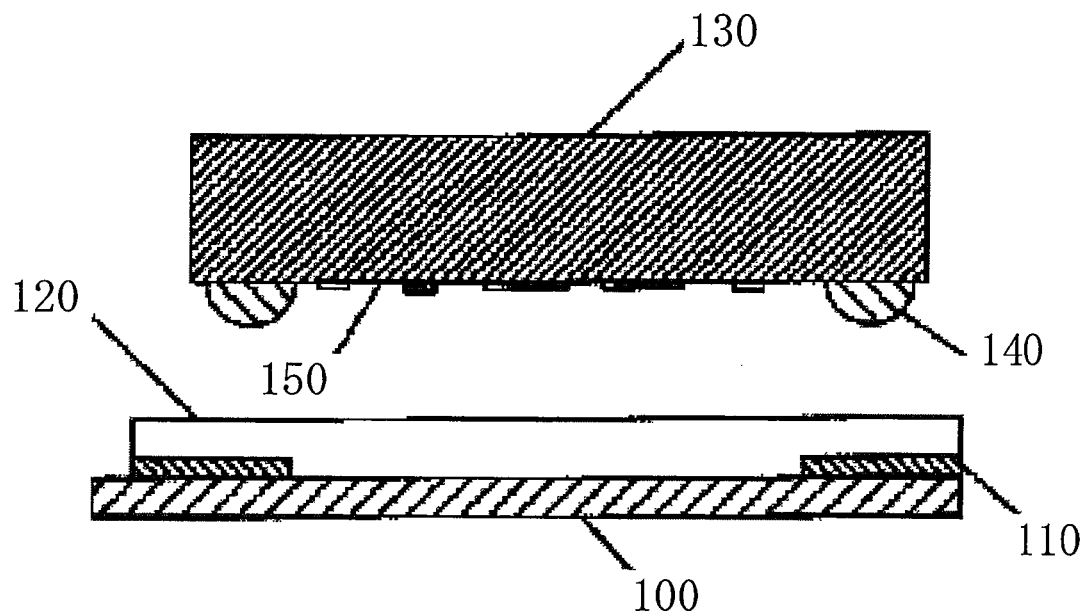
FIGS. 12A and 12B are cross-sectional views showing a conventional semiconductor element mounting method described in Japanese Patent No. 2589239.
Figure 12:
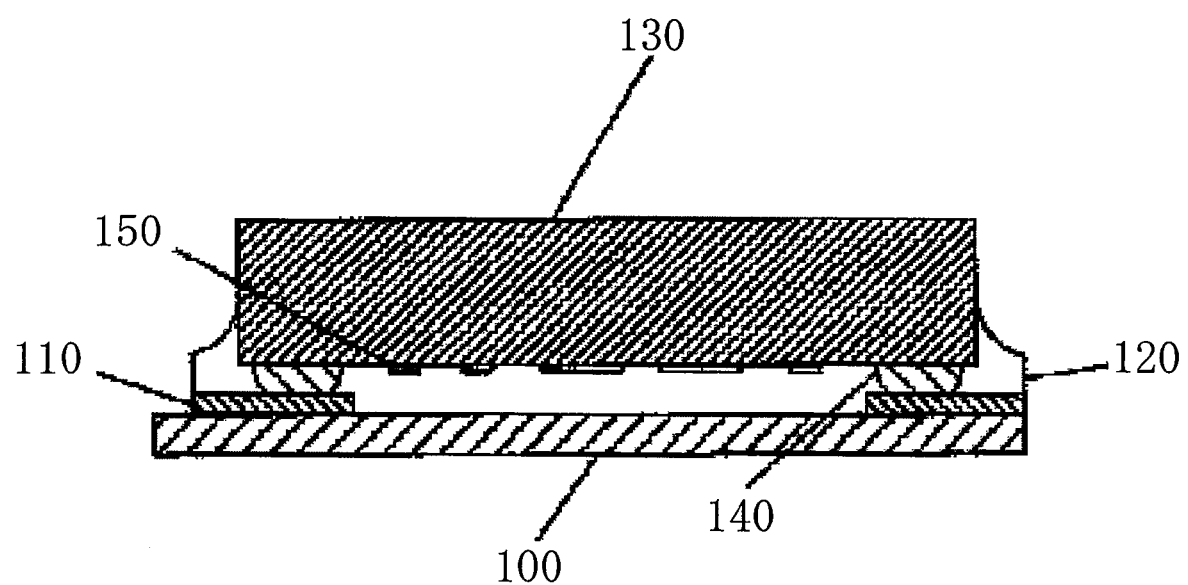

FIGS. 11A-11C are cross-sectional views showing a method for fabricating a semiconductor device according to an eighth embodiment of the present disclosure. An example semiconductor device having a package-on-package structure and its example fabrication method will be described hereinafter. Note that portions similar to those of the semiconductor device of the sixth embodiment will be described briefly or not at all.

Initially, in a step shown in FIG. 11A, a semiconductor element 1, and a substrate 2 including substrate electrodes 13 arranged two-dimensionally on an upper surface thereof, and electrode terminals 30 and solder bumps 32 connected with the electrode terminals 30 which are provided on a back surface thereof, are prepared. As is different from the sixth and seventh embodiments, the substrate electrodes 13 are provided in a region of the upper surface of the substrate 2 excluding a middle portion thereof (a region on which the semiconductor element 1 is mounted). A sealing film 3 including a first resin layer 3b and a second resin layer 3a is joined with the upper surface of the substrate 2, covering a portion of the substrate electrodes 13. The first resin layer 3b contains flux and the second resin layer 3a does not contain flux.

Next, in a step shown in FIG. 11B, the semiconductor element 1 is mounted onto the upper surface of the substrate 2 so that the back surface of the semiconductor element 1 faces the upper surface of the substrate 2. Next, electrodes provided on the upper surface (circuit-formed surface) of the semiconductor element 1 are connected to the exposed substrate electrodes 13 by fine metal lines, and the exposed substrate electrodes 13, the fine metal lines and the semiconductor element 1 are sealed with a sealing resin 75. Moreover, a semiconductor package 70 having a configuration similar to that of the sixth and seventh embodiments is prepared.

Next, in a step shown in FIG. 11C, the semiconductor package 70 including a second substrate 4 is mounted onto the upper surface of the substrate 2. In this case, the solder bumps 45 are positioned to contact the substrate electrodes 13 covered with the first resin layer 3b, and thereafter, pressure is applied onto the semiconductor package 70 while the semiconductor package 70 and the sealing film 3 are heated to a temperature at which the solder bump 45 is not melted. Next, the temperature of the solder bumps 45 is increased to a temperature higher than or equal to the melting point of the solder (e.g., 240° C.), and heating is continued so that a flux component of the first resin layer 3b is activated and the solder bumps 45 are melted. Thereafter, the solder bumps 45 are diffusion-bonded with the substrate electrodes 13.

As described above, the configuration of the present disclosure is applicable not only to a case where the semiconductor element 1 is mounted onto the substrate 2 by the BGA (Ball Grid Array) technique, but also to a case where the semiconductor element 1 is mounted onto the substrate 2 with the circuit-formed surface of the semiconductor element 1 facing upward, and the substrate electrodes 13 are connected to electrodes on the semiconductor element 1 using fine metal lines.

In the semiconductor device of this embodiment, the substrate electrodes 13 and the solder bumps 45 are bonded with each other while the substrate electrodes 13 are covered with the first resin layer 3b containing flux, whereby the formation of an oxide film on the bonding surface can be reduced, and the substrate electrodes 13 and the solder bumps 45 can be diffusion-bonded with each other with sufficient strength even when the solder does not contain lead.

Moreover, by using the sheet-like sealing film 3, the amount of flux supplied to the solder bumps 45 can be stabilized. Therefore, electrical conduction via the solder bumps 45 can be more reliably established. Therefore, even in the so-called package-on-package structure, electrical conduction between packages can be reliably established, whereby the yield of the semiconductor device can be improved.

Moreover, the overall amount of flux contained in the sealing film 3 can be reduced as compared to that in the conventional art. Therefore, the active agent concentration of the flux can be reduced, whereby the connection reliability between the substrate electrodes 13 and the electrode terminals 43 by the solder bumps 45 can be improved.

The aforementioned embodiments may be combined as appropriate without departing the scope and spirit of the present disclosure. For example, in the semiconductor devices of the sixth to eighth embodiments, solder bumps (corresponding to the solder bumps 17 of FIG. 7) may be provided on the substrate electrodes 13, 13a and 13b before the substrate electrodes 13, 13a and 13b are bonded with solder bumps. In the semiconductor device of the sixth embodiment, the solder bumps 9 may be replaced with the protruding electrodes of FIG. 7.

The configuration according to the example of the present disclosure is applicable not only to semiconductor devices, but also to electronic apparatuses including electronic parts which are bonded using solder. In particular, the present disclosure is useful for mounting of semiconductor elements having a narrower pitch, semiconductor elements having an interlayer insulating film made of a low-k material, and the like.

What is claimed is:

1. A semiconductor device comprising:
   a first electronic part including a first electrode;
   a first substrate including a first substrate electrode electrically connected to the first electrode on an upper surface thereof, wherein the first substrate electrode and the first electrode are arranged, facing each other;
   a first connecting member configured to connect the first electrode with the first substrate electrode; and
   a sealing material including a first resin portion which contains flux and contacts at least a first connection portion between the first connecting member and the first substrate electrode, and a second resin portion which does not contain the flux or contains a lower concentration of the flux than that of the first resin portion,
   wherein the number of the first electrodes and the number of the first substrate electrodes are both two or more,
   the first electronic part has a first region in which the first electrodes are arranged at a first pitch, and a second region in which the first electrodes are arranged at a second pitch broader than the first pitch,
   the sealing material includes the first resin portion and the second resin portion in a portion thereof corresponding to the first region, and includes the second resin portion in a portion thereof corresponding to the second region, and
   the sealing material has a double-layer structure having the first resin portion which is in the shape of a layer surrounding the first substrate electrode and the second resin portion which is in the shape of a layer in the region corresponding to the first region, and has a single-layer structure having only the second resin portion which is in the shape of a layer in the region corresponding to the second region.

2. The semiconductor device of claim 1, wherein the first connecting member is solder.

3. The semiconductor device of claim 1, wherein the first connecting member includes solder and a protruding electrode provided on the first electrode.

4. A semiconductor device comprising:
   a first electronic part including a first electrode;
   a first substrate including a first substrate electrode electrically connected to the first electrode on an upper surface thereof, wherein the first substrate electrode and the first electrode are arranged, facing each other;
   a first connecting member configured to connect the first electrode with the first substrate electrode;
   a sealing material including a first resin portion which contains flux and contacts at least a first connection portion between the first connecting member and the first substrate electrode, and a second resin portion which does not contain the flux or contains a lower concentration of the flux than that of the first resin portion; and
   a second electronic part mounted on the upper surface of the first substrate, and including a first semiconductor element and a second electrode electrically connected to a circuit-formed surface of the first semiconductor element,
   wherein a second substrate electrode electrically connected to the second electrode is further provided on the upper surface of the first substrate, and
   the first electronic part is a semiconductor package including a second substrate including the first electrode on a back surface thereof, and a second semiconductor element mounted on an upper surface of the second substrate.

5. The semiconductor device of claim 4, further comprising:
   a second connecting member configured to connect the second electrode with the second substrate electrode,
   wherein the second electrode is provided on the circuit-formed surface of the first semiconductor element,
   the first semiconductor element is mounted on the first substrate with the circuit-formed surface of the first semiconductor clement facing the upper surface of the first substrate, and
   the first resin portion contacts at least a second connection portion between the second connecting member and the second substrate electrode.

6. The semiconductor device of claim 4, further comprising:
   a second connecting member configured to connect the second electrode with the second substrate electrode,
   wherein the second electronic part further includes a third substrate including the second electrode provided on a back surface thereof, and the first semiconductor element provided on an upper surface thereof, and
   the first resin portion contacts at least a second connection portion between the second connecting member and the second substrate electrode.

7. The semiconductor device of claim 4, further comprising:
   a fine metal line configured to connect the second substrate electrode to the second electrode,
   wherein the first semiconductor element is mounted on the first substrate with the circuit-formed surface of the first semiconductor element on which the second electrode is provided facing upward.

* * * * *